United States Patent
Lin et al.

(10) Patent No.: US 11,211,414 B2
(45) Date of Patent: Dec. 28, 2021

(54) IMAGE SENSOR PACKAGE

(71) Applicant: OMNIVISION TECHNOLOGIES, INC., Santa Clara, CA (US)

(72) Inventors: Wei-Feng Lin, Hsinchu (TW); Ying-Chih Kuo, Hsinchu (TW); Ying Chung, Taichung (TW)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 125 days.

(21) Appl. No.: 16/725,698

(22) Filed: Dec. 23, 2019

(65) Prior Publication Data

US 2021/0193716 A1     Jun. 24, 2021

(51) Int. Cl.
*H01L 27/146*     (2006.01)

(52) U.S. Cl.
CPC .. *H01L 27/14618* (2013.01); *H01L 27/14634* (2013.01)

(58) Field of Classification Search
CPC ................................. H01L 27/14618
See application file for complete search history.

(56) References Cited

U.S. PATENT DOCUMENTS

| | | |
|---|---|---|
| 5,532,513 A | 7/1996 | Smith et al. |
| 6,384,473 B1 | 5/2002 | Peterson et al. |
| 7,102,220 B2 * | 9/2006 | Stevens ............... H01L 23/055 257/686 |
| 7,659,134 B2 * | 2/2010 | Chia ................ H01L 27/14618 438/65 |
| 8,796,706 B2 | 8/2014 | Jung et al. |
| 8,981,511 B2 | 3/2015 | Kinsman et al. |
| 9,048,391 B2 | 6/2015 | Jung et al. |
| 9,257,624 B2 | 2/2016 | Jung et al. |
| 9,472,743 B2 | 10/2016 | Jung et al. |
| 9,786,827 B2 | 10/2017 | Jung et al. |
| 9,935,144 B1 | 4/2018 | Lin et al. |
| 10,243,014 B2 | 3/2019 | Lin et al. |
| 10,319,766 B2 * | 6/2019 | Harazono .............. H01L 27/14 |
| 2005/0051884 A1 | 3/2005 | Stevens et al. |
| 2007/0148807 A1 | 6/2007 | Akram |
| 2007/0152345 A1 | 7/2007 | Wu et al. |
| 2008/0315386 A1 | 12/2008 | Kudo et al. |
| 2012/0056217 A1 | 3/2012 | Jung et al. |
| 2012/0262903 A1 | 10/2012 | Li et al. |

(Continued)

OTHER PUBLICATIONS

Taiwanese Office Action and Translation dated Sep. 11, 2018 for Taiwanese Application No. 106141083, filed Nov. 27, 2017, 17 pages.

(Continued)

*Primary Examiner* — David A Zarneke
(74) *Attorney, Agent, or Firm* — Christensen O'Connor Johnson Kindness PLLC

(57) ABSTRACT

An image sensor package includes a transparent substrate with a recess formed in the transparent substrate, and an image sensor positioned in the recess so that light incident on the transparent substrate passes through the transparent substrate to the image sensor. The image sensor package also includes a circuit board electrically disposed in the recess and coupled to receive image data from the image sensor, and the image sensor is positioned in the recess between the circuit board and the transparent substrate.

10 Claims, 5 Drawing Sheets

(56) References Cited

U.S. PATENT DOCUMENTS

| | | |
|---|---|---|
| 2013/0015478 A1 | 1/2013 | Oh et al. |
| 2013/0062591 A1 | 3/2013 | Jun et al. |
| 2014/0048951 A1 | 2/2014 | Lin et al. |
| 2014/0117473 A1 | 5/2014 | Kierse et al. |
| 2014/0264395 A1 | 9/2014 | Lee et al. |
| 2015/0060932 A1 | 3/2015 | Huang et al. |
| 2016/0028983 A1* | 1/2016 | Uya ................. H01L 27/14621 348/340 |
| 2016/0126221 A1 | 5/2016 | Windisch et al. |
| 2016/0149088 A1 | 5/2016 | Yan et al. |
| 2016/0291265 A1 | 10/2016 | Kinghorn et al. |
| 2021/0135577 A1* | 5/2021 | Li ....................... H02M 7/4833 |

OTHER PUBLICATIONS

Taiwanese Office Action and Translation dated Dec. 25, 2018 for Taiwanese Application No. 106141083, filed Nov. 27, 2017, 13 pages.

* cited by examiner

IMAGE SENSOR PACKAGE

TECHNICAL FIELD

This disclosure relates generally to semiconductor device packaging, and in particular but not exclusively, relates to image sensor packaging.

BACKGROUND INFORMATION

Image sensors have become ubiquitous. They are widely used in digital still cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

In order to produce high quality images, the image sensor needs to be sufficiently electrically isolated to prevent unwanted electrical distortion. Conventional packaging materials may not possess adequate insulative properties for modern sensors. Accordingly, new packaging materials may be used.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
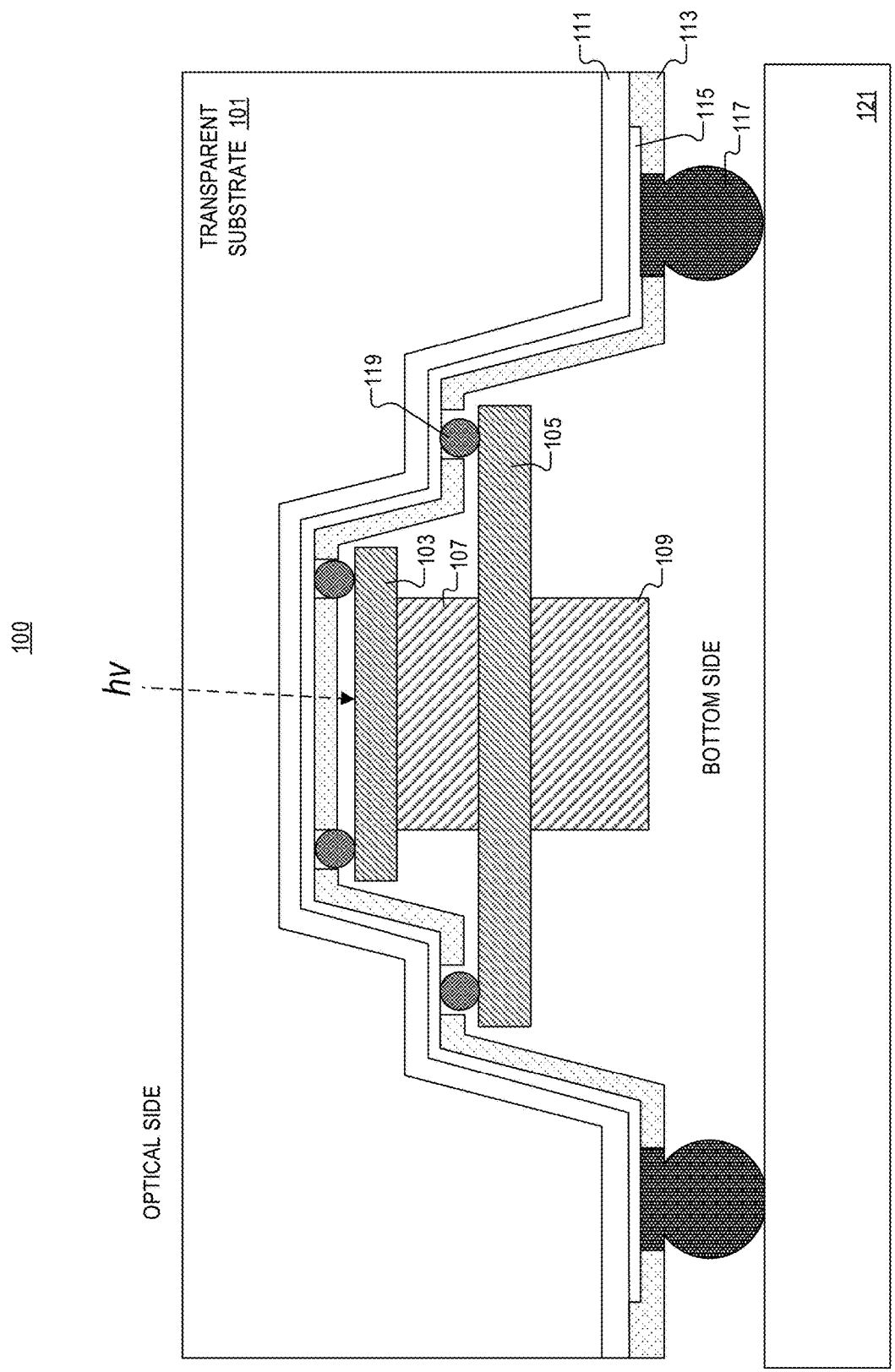
FIGS. 1A-1C illustrate an image sensor package, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor package are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Examples discussed herein refer to a novel image sensor package that may include a wafer-level glass substrate and anti-reflective (AR)/infrared (IR) or AR/IR films that can be applied on the glass substrate. This enables high quality image sensor packages which may be used in automotive applications (e.g., in autonomous, or partially autonomous, vehicles). The structure shown here beneficially results in a smaller package size (e.g., stack in a vertical direction and not a side-by-side orientation) and thinner package height (e.g., flip-chip bond instead of wire bond). Moreover, since the architecture here may use an image sensor and ASIC system-in-package, the proposed structure reduces the complexity of assembly for image sensor packages, resulting in cost savings.

The following disclosure will further describe the embodiments discussed above, and other embodiments, as they relate to the figures.

Figure 1C:
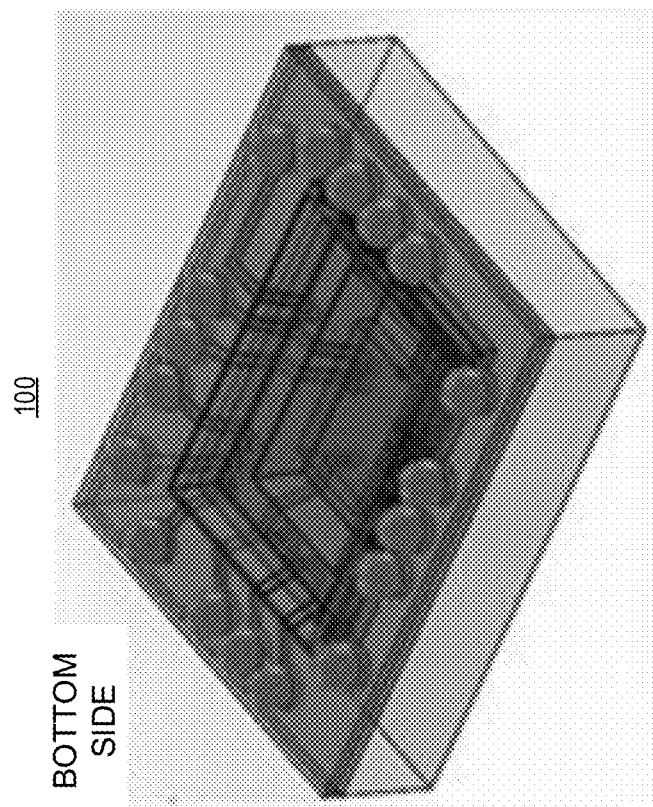
Figure 1B:
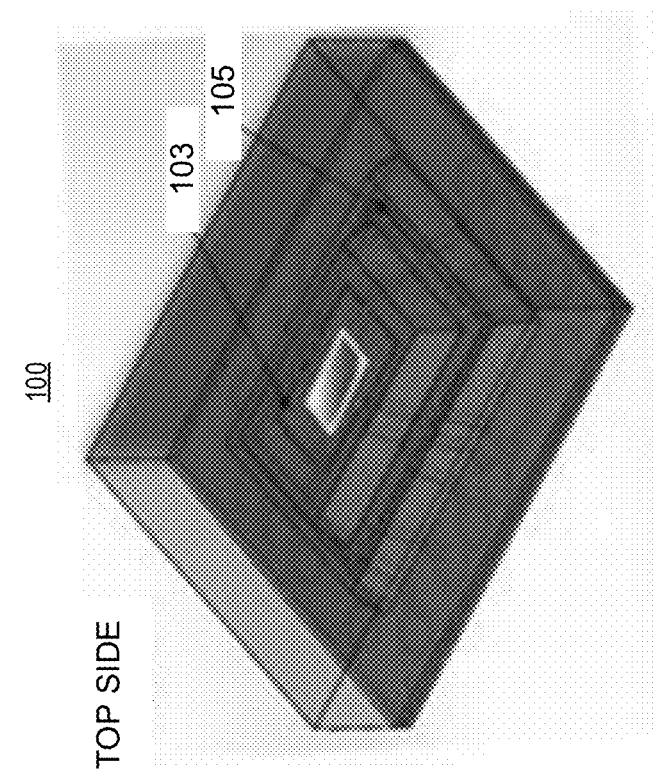

FIGS. 1A-1C illustrate an image sensor package 100, in accordance with the teachings of the present disclosure. As shown, FIG. 1A illustrates a cross sectional view of image sensor package 100 which depicts transparent substrate 101, image sensor 103, circuit board 105, first heat sink 107, second heat sink 109, first passivation layer 111, second passivation layer 113, conductive traces 115, solder balls 117, metal bumps 119, and printed circuit board 121. As shown, light (hv) is depicted passing through the optical side of transparent substrate 101 to image sensor 103, which will convert the image light to image charge/image data.

As shown, transparent substrate 101 (e.g., glass, quartz, clear polymer, or the like) has a recess formed in it. Image sensor 103 (e.g., CMOS image sensor or the like) is positioned in the recess so that light incident on transparent substrate 101 passes through transparent substrate 101 to the image sensor 103. Circuit board 105 is disposed in the recess, and coupled to receive image data from image sensor 103, and image sensor 103 is positioned in the recess between circuit board 105 and transparent substrate 101.

First heat sink 107 (e.g., a finned heat sink, thermoelectric cooler, or the like) is disposed between image sensor 103 and circuit board 105, and is thermally coupled to remove heat from image sensor 103. As shown, first heat sink 107 may have a smaller lateral area (e.g., where heat sink 107 touches image sensor 103) than image sensor 103. In the depicted example, first heat sink 107 may also be thermally coupled to circuit board 105. Second heat sink 109 is thermally coupled to circuit board 105 to remove heat from circuit board 105, and circuit board 105 is disposed between first heat sink 107 and second heat sink 109. As shown, second heat sink 109 may have a smaller lateral area than circuit board 105. In the depicted example, ledges are disposed in the recess, and circuit board 105 spans the distance between the ledges in the recess. Additionally, the recess includes a first trapezoidal region defined between the ledges, and a second trapezoidal region that is larger than the first trapezoidal region. However, one of ordinary skill in the art will appreciate that the recess may take other shapes, in accordance with the teachings of the present disclosure.

In the depicted example, first passivation layer 111 (e.g., a transparent material like polyimdie, optical liquid silicon rubber, or the like) is formed on transparent substrate 101 and disposed at least in part between transparent substrate 101 and image sensor 103. Conductive traces 115 (e.g., metal like copper, gold, aluminum, or the like) are formed on first passivation layer 111, and at least some of conductive traces 115 electrically couple circuit board 105 to image sensor 103. Second passivation layer 113 may be disposed at least in part on conductive traces 115 in order to prevent degradation/corrosion of conductive traces 115. Circuit board 105 is coupled to conductive traces 115 through gaps/discontinuities in second passivation layer 113. In some examples, circuit board 105 includes function logic (e.g., in a processor like an ASIC included in circuit board 105) coupled to manipulate the image data output from the image sensor.

As shown, image sensor 103 and circuit board 105 may be coupled to conductive traces 115 via metal bumps (e.g., gold, or the like) which extend through the discontinuities in second passivation layer 113; and the conductive traces run along the side walls of transparent substrate 101. As shown, conductive traces may then be coupled to an additional printed circuit board 121 or the like through solder balls 117.

FIG. 1B shows a top-down semi-transparent 3D view of image sensor package 100 of FIG. 1A. It is appreciated that some labels have been omitted to ovoid obscuring certain aspects of the disclosure, but that all of the components from FIG. 1A are included in FIG. 1B in accordance with teachings of the present disclosure.

As depicted, the recess shape is two three-dimensional trapezoids stacked on top of one another, so that the top trapezoid is smaller than the bottom (forming a tiered pyramid-type shape). Image sensor 103 is disposed proximate to the top of the smaller 3D trapezoid, and circuit board 105 is disposed near the top of the larger 3D trapezoid. As shown, conductive traces 115 run up the side of the recess to connect to contacts on the image sensor 103 and circuit board 105. Conductive traces 115 are then connected to printed circuit board 121 (which has substantially the same lateral dimensions as transparent substrate 101) via solder balls 117 (which may include lead, in, copper, silver, bismuth, indium, zinc, antimony, or the like). As shown, a first portion of conductive traces 115 only run to the top of the recess to contact image sensor 103, and a second portion of conductive traces 115 only extend to the ledges to contact circuit board 105.

FIG. 1C shows the underside of the image sensor package 100 of FIGS. 1A and 1B. In the depicted example, printed circuit board 121 is shown as partially transparent in order to see the other pieces of device architecture. As shown, solder balls 117 may be mounted to electrical contacts on printed circuit board 121 which extend through printed circuit board 121.

Figure 2:
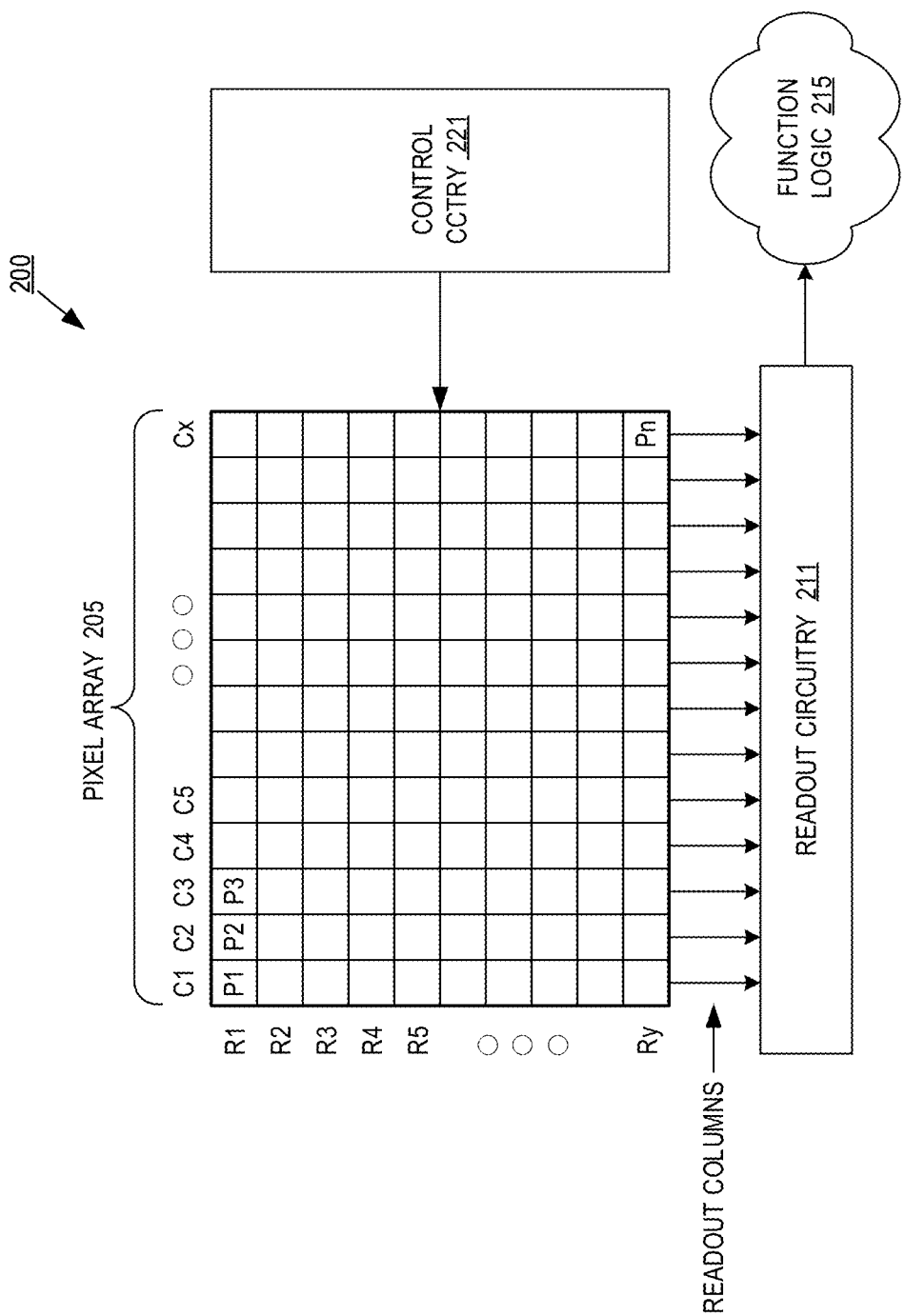
FIG. 2 illustrates a block diagram of an image sensor system, in accordance with the teachings of the present invention.

FIG. 2 illustrates a block diagram of an imaging system 200 which may be included in the image sensor package of FIG. 1, in accordance with the teachings of the present invention. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2, ..., Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., autofocus, crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash. In some embodiments, any one of control circuitry 221, readout circuitry 211, and function logic 215 may be disposed, in whole or part, in the image sensor, in the circuit board, or in the printed circuit board depicted in FIG. 1A.

In one example, image sensor package 100 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

FIGS. 3A-3G illustrate a method of image sensor package fabrication, in accordance with the teachings of the present invention. One of skill in the art will appreciate that the steps depicted in FIGS. 3A-3G may occur in any order and even in parallel. Additionally, steps may be added to, or removed from, the method in accordance with the teachings of the present disclosure.

Figure 3A:
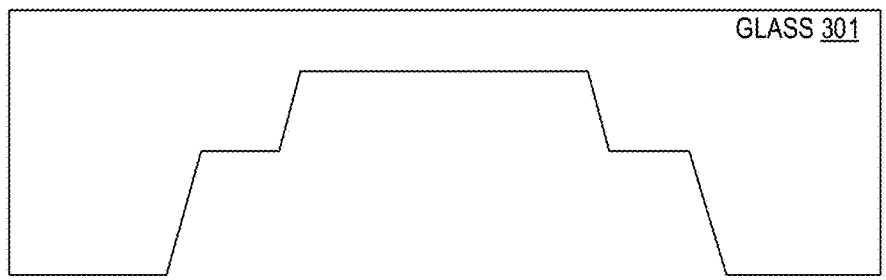
FIGS. 3A-3G illustrate a method of image sensor package fabrication, in accordance with the teachings of the present invention.

FIG. 3A shows, forming a recess in a transparent substrate. In some examples, a sheet of glass (one example of a transparent substrate material) may be etched or cut to produce many recesses on the sheet of glass. The sheet may then be diced into many substrates for packages, with each package including one recess. In some examples, forming the recess includes creating ledges disposed in the recess. In some examples, ledges may be formed by creating a recess that includes a first trapezoidal region defined between the ledges, and a second trapezoidal region, where the first trapezoidal region is smaller than the second trapezoidal region.

Figure 3B:
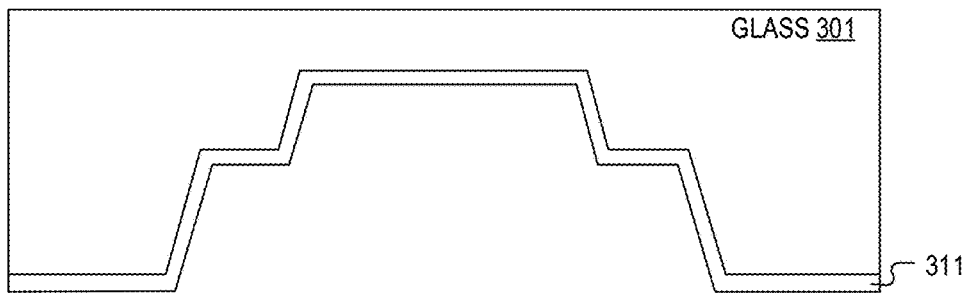

FIG. 3B depicts forming (e.g., depositing with thermal evaporation, chemical vapor deposition, fluid coating, or the like) a passivation layer on the transparent substrate. In some examples, the passivation layer is also transparent to the visible spectrum. It is appreciated that both passivation layers (and the conductive traces) may be formed before dicing to form the individual transparent substrates.

Figure 3C:
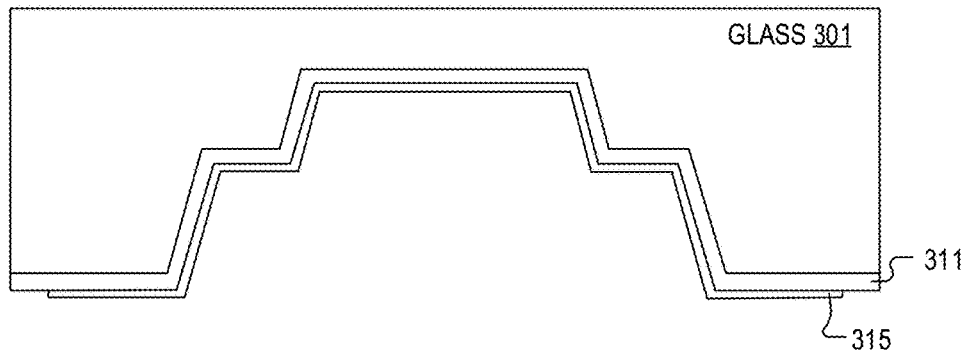

FIG. 3C shows forming conductive traces (e.g., with masking and thermal evaporation, or using printing techniques) on the first passivation layer in the recess so that the first passivation layer is disposed between the conductive traces and the transparent substrate at least in part. Conductive traces may include metal such as gold, aluminum, copper, silver or the like.

Figure 3D:
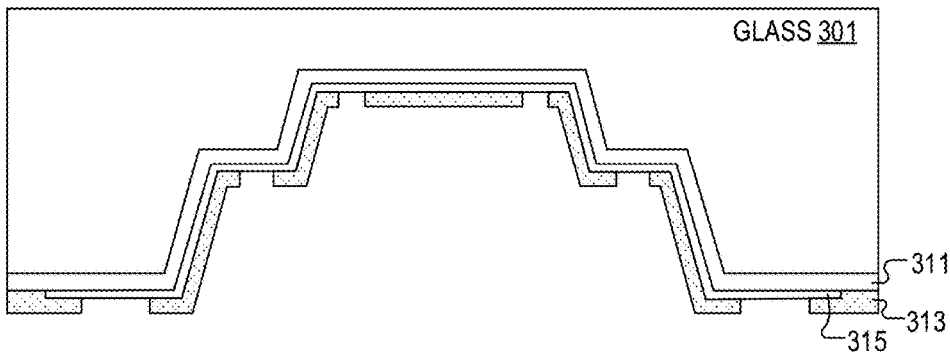

FIG. 3D illustrates forming a second passivation layer so that the conductive traces are disposed at least in part between the first passivation layer and the second passivation layer. It is appreciated that the first passivation layer may be the same material as the second passivation layer, or they may be made from different materials. Additionally, there may be discontinuities (or holes) in the second passivation layer to permit forming electrical contact with the conductive traces. In some examples, these holes may be created using masking or photolithographic techniques.

Figure 3E:
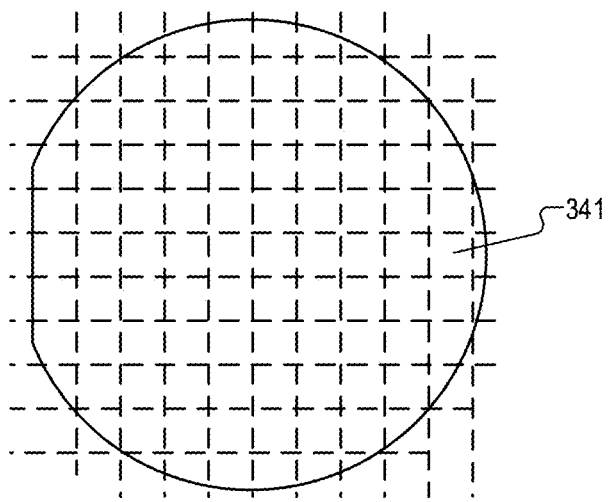

FIG. 3E illustrates producing both the image sensor and other computer chips. FIG. 3E also depicts dicing the wafers 341 once the chips are formed.

Figure 3F:
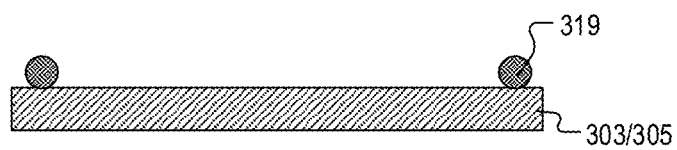

FIG. 3F illustrates forming one or more metallic bumps (e.g., gold, silver, copper, or the like) on at least one of the image sensor or the circuit board. And once the image sensor and circuit board are placed in the recess, the metallic bumps will be coupled to the conductive traces.

Figure 3G:
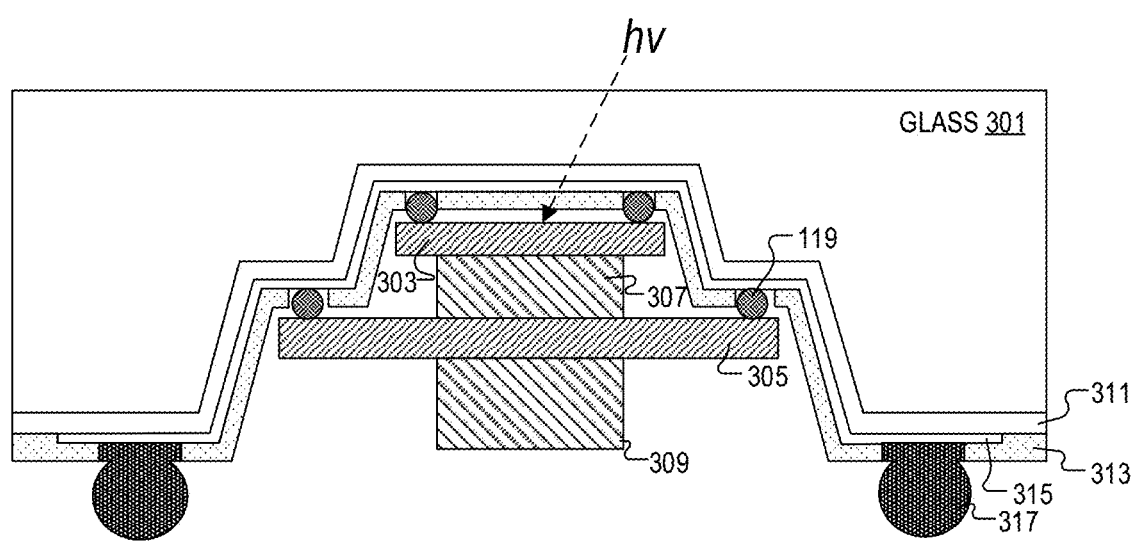

FIG. 3G depicts inserting an image sensor into the recess so that the image sensor is positioned in the recess to receive light through the transparent substrate. FIG. 3G also depicts inserting a circuit board into the recess so that the image sensor is positioned between the transparent substrate and the circuit board. In one example, the image sensor is positioned between the illuminated side of the transparent substrate and the circuit board so that some of the light directed to the circuit board is blocked by the image sensor. In some examples, inserting both the image sensor and the circuit board may occur at the same time, while in other examples it may occur at separate times. In some examples, placing the circuit board in the recess includes positioning the circuit board to span the distance between the ledges in the recess (e.g., edges of the circuit board are attached to each ledge).

In the depicted example, a first heat sink is inserted into the recess and positioned between the image sensor and the circuit board, and thermally coupled to remove heat form the image sensor. Similarly, a second heat sink is inserted in the recess and thermally coupled to the circuit board to remove heat from the circuit board, where the circuit board is disposed between the first heat sink and the second heat sink.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor package, comprising:
   a transparent substrate with a recess formed in the transparent substrate;
   an image sensor positioned in the recess so that light incident on the transparent substrate passes through the transparent substrate to the image sensor;
   a circuit board electrically disposed in the recess and coupled to receive image data from the image sensor, wherein the image sensor is positioned in the recess between the circuit board and the transparent substrate.

2. The image sensor package of claim 1, further comprising a first heat sink disposed between the image sensor and the circuit board, and thermally coupled to remove heat from the image sensor.

3. The image sensor package of claim 2, further comprising a second heat sink thermally coupled to the circuit board to remove heat from the circuit board, wherein the circuit board is disposed between the first heat sink and the second heat sink.

4. The image sensor package of claim 1, further comprising ledges disposed in the recess, wherein the circuit board spans the distance between the ledges in the recess.

5. The image sensor package of claim 4, wherein the recess includes a first trapezoidal region defined between the ledges, and a second trapezoidal region, wherein the first trapezoidal region is smaller than the second trapezoidal region.

6. The image sensor package of claim 1, further comprising a first passivation layer formed on the transparent substrate and disposed, at least in part, between the transparent substrate and the image sensor.

7. The image sensor package of claim 6, further comprising conductive traces form on the first passivation layer, wherein at least some of the conductive traces electrically couple the circuit board to the image sensor.

8. The image sensor package of claim 7, further comprising a second passivation layer disposed, at least in part, on the conductive traces.

9. The image sensor of claim 8, wherein the circuit board is coupled to the metal traces through gaps in the second passivation layer.

10. The image sensor package of claim 1, wherein the circuit board includes function logic coupled to manipulate the image data output from the image sensor.

* * * * *